United States Patent
Hui et al.

(10) Patent No.: US 11,191,065 B2
(45) Date of Patent: Nov. 30, 2021

(54) CODING TECHNIQUE FOR MULTI-STAGE CONTROL INFORMATION

(71) Applicant: Telefonaktiebolaget LM Ericsson (publ), Stockholm (SE)

(72) Inventors: Dennis Hui, Sunnyvale, CA (US); Yufei Blankenship, Kildeer, IL (US)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 192 days.

(21) Appl. No.: 15/750,560

(22) PCT Filed: Dec. 26, 2017

(86) PCT No.: PCT/IB2017/058405
§ 371 (c)(1),
(2) Date: Feb. 6, 2018

(87) PCT Pub. No.: WO2018/127771
PCT Pub. Date: Jul. 12, 2018

(65) Prior Publication Data
US 2019/0306838 A1    Oct. 3, 2019

Related U.S. Application Data

(60) Provisional application No. 62/444,364, filed on Jan. 9, 2017.

(51) Int. Cl.
*H04W 72/04* (2009.01)
*H03M 13/09* (2006.01)
(Continued)

(52) U.S. Cl.
CPC ......... *H04W 72/042* (2013.01); *H03M 13/09* (2013.01); *H03M 13/091* (2013.01);
(Continued)

(58) Field of Classification Search
None
See application file for complete search history.

(56) References Cited

U.S. PATENT DOCUMENTS

2015/0295593 A1* 10/2015 Trifonov ........... H03M 13/3746
714/776
2016/0128028 A1    5/2016 Mallik et al.
(Continued)

FOREIGN PATENT DOCUMENTS

CN        1464656 A    12/2003
CN      101617559 A    12/2009
(Continued)

OTHER PUBLICATIONS

Arikan, Erdal "Channel Polarization: A Method for Constructing Capacity-Achieving Codes for Symmetric Binary-Input Memoryless Channels" IEEE Transactions on Information Theory Jul. 2009 (Year: 2009).*

(Continued)

*Primary Examiner* — Jeffrey M Rutkowski
*Assistant Examiner* — Basil Ma
(74) *Attorney, Agent, or Firm* — Withrow & Terranova, PLLC

(57) ABSTRACT

Systems and methods for multi-stage downlink control information transmission in a manner that supports existing polar codes are provided. In some embodiments, a method of operation of a radio access node in a cellular communications network to transmit multi-stage downlink control information comprises transmitting a first part of a multi-stage downlink control information in a first Orthogonal Frequency Division Multiplexing (OFDM) symbol and transmitting a second part of the multi-stage downlink control information in a second OFDM symbol that is subsequent to the first OFDM symbol. Cyclic Redundancy Check (CRC) bits are attached to the first part of the (Continued)

multi-stage downlink control information and/or CRC bits are attached to the second part of the multi-stage downlink control information. In some embodiments, the first part and/or the second part of the multi-stage downlink control information is encoded using a polar encoder.

24 Claims, 12 Drawing Sheets

(51) Int. Cl.
*H03M 13/13* (2006.01)
*H04L 1/00* (2006.01)
*H04L 5/00* (2006.01)
*H03M 13/35* (2006.01)

(52) U.S. Cl.
CPC ......... *H03M 13/13* (2013.01); *H03M 13/356* (2013.01); *H04L 1/0041* (2013.01); *H04L 1/0057* (2013.01); *H04L 1/0061* (2013.01); *H04L 1/0072* (2013.01); *H04L 5/0007* (2013.01)

(56) References Cited

U.S. PATENT DOCUMENTS

| | | | | |
|---|---|---|---|---|
| 2017/0366199 | A1* | 12/2017 | Ge | H03M 13/09 |
| 2018/0192403 | A1* | 7/2018 | Shelby | H04L 1/0041 |
| 2019/0053201 | A1* | 2/2019 | Nammi | H04L 1/0072 |
| 2019/0393987 | A1* | 12/2019 | Hong | H04L 1/0057 |

FOREIGN PATENT DOCUMENTS

| | | |
|---|---|---|
| CN | 102299770 A | 12/2011 |
| CN | 102752070 A | 10/2012 |
| WO | 2014107903 A1 | 7/2014 |

OTHER PUBLICATIONS

Ericsson, "R1-1700112: Polar Code Design for Control Channel of NR," Third Generation Partnership Project (3GPP) TSG RAN WG1 AH_NR Meeting, Jan. 16-20, 2017, Spokane, Washington, USA, 3 pages.

Huawei, et al., "R1-162588: DCI design for short TTI," Third Generation Partnership Project (3GPP) TSG RAN WG1 Meeting #84bis, Apr. 11-15, 2016, Busan, Korea, 11 pages.

Mediatek Inc., "R1-1612121: On 2-stage Downlink Control Information for NR," Third Generation Partnership Project (3GPP) TSG RAN WG1 Meeting #87, Nov. 14-18, 2016, Reno, Nevada, USA, 5 pages.

Mediatek Inc., "R1-1612135: Comparison of cording candidates for DL control channels and extended applications," Third Generation Partnership Project (3GPP) TSG RAN WG1 Meeting #87, Nov. 14-18, 2016, Reno, Nevada, USA, 5 pages.

International Search Report and Written Opinion for International Patent Application No. PCT/IB2017/058405, dated Apr. 12, 2018, 18 pages.

Arikan, E., "Channel Polarization: A Method for Constructing Capacity-Achieving Codes for Symmetric Binary-Input Memoryless Channels," IEEE Transactions on Information Theory, vol. 55, No. 7, Jul. 2009, pp. 3051-3073.

Tal, I. et al., "List Decoding of Polar Codes," IEEE International Symposium on Information Theory, 2011, St. Petersburg, 5 pages.

Office Action for Chinese Patent Application No. 2017800882009, dated Sep. 15, 2021, 8 pages (no translation available).

\* cited by examiner

US 11,191,065 B2

CODING TECHNIQUE FOR MULTI-STAGE CONTROL INFORMATION

RELATED APPLICATIONS

This application is a 35 U.S.C. § 371 national phase filing of International Application No. PCT/IB2017/058405, filed Dec. 26, 2017, which claims the benefit of provisional patent application Ser. No. 62/444,364, filed Jan. 9, 2017, the disclosures of which are hereby incorporated herein by reference in their entireties.

TECHNICAL FIELD

Embodiments described herein relate to the field of wireless communication; and more specifically, to a coding technique that provides error detection and error control functions for multi-stage control information.

BACKGROUND

Encoding and Decoding of Polar Codes

Polar codes, proposed by Arikan [1], are the first class of constructive coding schemes that are provable to achieve the symmetric capacity of the binary-input discrete memoryless channels under a low-complexity Successive Cancellation (SC) decoder. However, the finite-length performance of polar codes under SC is not competitive compared to other modern channel coding schemes such as Low-Density Parity-Check (LDPC) codes and turbo codes. Later, an SC List (SCL) decoder is proposed in Tal [2], which can approach the performance of an optimal Maximum-Likelihood (ML) decoder. By concatenating a simple Cyclic Redundancy Check (CRC) coding, it was shown that the performance of concatenated polar code is competitive with that of well-optimized LDPC and turbo codes. As a result, polar codes are being considered as a candidate for future Fifth Generation (5G) wireless communication systems.

The main idea of polar coding is to transform a pair of identical binary-input channels into two distinct channels of different qualities, one better and one worse than the original binary-input channel. By repeating such a pair-wise polarizing operation on a set of $2^M$ independent uses of a binary-input channel, a set of $2^M$ "bit-channels" of varying qualities can be obtained. Some of these bit channels are nearly perfect (i.e., error free) while the rest of them are nearly useless (i.e., totally noisy). The point is to use the nearly perfect channel to transmit data to the receiver while setting the input to the useless channels to have fixed or frozen values (e.g., 0) known to the receiver. For this reason, those input bits to the nearly useless and the nearly perfect channel are commonly referred to as frozen bits and non-frozen (or information) bits, respectively. Only the non-frozen bits are used to carry data in a polar code. An illustration of the structure of a length-8 polar code is illustrated in FIG. 1. FIG. 1 is an example of a polar code structure with N=8 which serves as the first transmission in Hybrid Automatic Repeat Request (HARQ) with incremental redundancy.

FIG. 2 illustrates the labeling of the intermediate information bits $s_{l,i}$, where $l \in \{0,1, \ldots, n\}$ and $i \in \{0,1, \ldots, N-1\}$ during polar encoding with N=8. The intermediate information bits are related by the following equations:

$$s_{l+1,i} = s_{l,i} \oplus s_{l,i+2^l}, \text{ for } i \in \left\{ j \in \{0, 1, \ldots, N-1\}: \mathrm{mod}\left(\left\lfloor \frac{j}{2^l} \right\rfloor, 2\right) = 0 \right\}$$

-continued $$s_{l+1,i+2^l} = s_{l,i+2^l}, \text{ for } i \in \left\{ j \in \{0, 1, \ldots, N-1\}: \mathrm{mod}\left(\left\lfloor \frac{j}{2^l} \right\rfloor, 2\right) = 0 \right\}$$

and $l \in \{0,1, \ldots, n-1\}$, with $s_{0,i} \equiv u_i$ being the information bits, and $s_{n,i} \equiv x_i$ being the code bits, for $i \in \{0,1, \ldots, N-1\}$.

Multi-stage Control Information

For New Radio (NR), it has been proposed that control information being transmitted in multi-stage, in addition to defining single-stage Downlink Control Information (DCI). While more than one stages are possible, in this document two stages are assumed, where the DCI content is split into two parts. The first part is transmitted first in time (e.g., within an earlier Orthogonal Frequency Division Multiplexing (OFDM) symbol), the second part is transmitted later in time (e.g., within a later OFDM symbol). To obtain the complete DCI, the User Equipment device (UE) needs to receive both DCI_part1 and DCI_part2 and to be able to decode DCI_part1 independently without DCI_part2. In one example, the resource allocation information is carried in DCI_part1, while the Modulation and Coding Scheme (MCS) and HARQ related information are carried in DCI_part2.

The first stage DCI (i.e., DCI_part1) resides in an OFDM symbol dedicated to control. The second-stage DCI (i.e., DCI_part2) resides in a later OFDM symbol, which can be a later OFDM symbol also dedicated to control as illustrated in FIG. 3 or a later OFDM symbol used for downlink data transmission as illustrated in FIG. 4. DCI_part1 and DCI_part2 can use the same set of frequency resources, or different frequency resources. In FIG. 3 and FIG. 4, for brevity, CRC bits attached to DCI are not shown.

Multi-stage control has been observed to provide several benefits. For example, it helps to improve the timeline of processing downlink control and data.

Existing polar codes are designed to support a single-stage DCI transmission. It is not clear how to best support two-stage DCI transmission using existing polar codes.

SUMMARY

Systems and methods for multi-stage Downlink Control Information (DCI) transmission in a manner that supports existing polar codes are provided. In some embodiments, a method of operation of a radio access node in a cellular communications network to transmit multi-stage DCI comprises transmitting a first part of a multi-stage DCI in a first Orthogonal Frequency Division Multiplexing (OFDM) symbol and transmitting a second part of the multi-stage DCI in a second OFDM symbol that is subsequent to the first OFDM symbol. Cyclic Redundancy Check (CRC) bits are attached to the first part of the multi-stage DCI and/or CRC bits are attached to the second part of the multi-stage DCI. In some embodiments, the first part of the multi-stage DCI is encoded using a polar encoder and/or the second part of the multi-stage DCI is encoded using a polar encoder.

In some embodiments, first CRC bits are attached to the first part of the multi-stage DCI and second CRC bits are attached to the second part of the multi-stage DCI. In some embodiments, transmitting the first part of the multi-stage DCI in the first OFDM symbol comprises attaching the first CRC bits to the first part of the multi-stage DCI to provide a first sequence of bits comprising the first part of the multi-stage DCI and the first CRC bits, encoding the first sequence of bits to provide a first plurality of coded bits, and transmitting the first plurality of coded bits in the first OFDM symbol. In some embodiments, transmitting the second part of the multi-stage DCI in the second OFDM symbol comprises attaching the second CRC bits to the second part of the multi-stage DCI to provide a second sequence of bits comprising the second part of the multi-stage DCI and the second CRC bits, encoding the second sequence of bits to provide a second plurality of coded bits, and transmitting the second plurality of coded bits in the second OFDM symbol.

In some embodiments, CRC bits are attached to the first part of the multi-stage DCI and CRC bits are not attached to the second part of the multi-stage DCI.

In some embodiments, CRC bits are attached to the second part of the multi-stage DCI and CRC bits are not attached to the first part of the multi-stage DCI. In some embodiments, the CRC bits attached to the second part of the multi-stage DCI are CRC bits for both the first and second parts of the multi-stage DCI. In some embodiments, the first part of the multi-stage DCI is encoded using a first channel coding technique and the second part of the multi-stage DCI is encoded using a second channel coding technique that is different than the first channel coding technique. In some embodiments, one of the first channel coding technique and the second channel coding technique is a polar coding technique. In some other embodiments, the first part of the multi-stage DCI and the second part of the multi-stage DCI are encoded using a same channel coding technique.

In some embodiments, transmitting the first part of the multi-stage DCI in the first OFDM symbol comprises encoding the first part of the multi-stage DCI to provide a first plurality of coded bits and transmitting the first plurality of coded bits in the first OFDM symbol. Transmitting the second part of the multi-stage DCI in the second OFDM symbol comprises encoding the second part of the multi-stage DCI using a polar encoder that uses the first part of the multi-stage DCI as frozen bits to provide a second plurality of coded bits and transmitting the second plurality of coded bits in the second OFDM symbol.

In some embodiments, transmitting the first part of the multi-stage DCI in the first OFDM symbol comprises encoding the first part of the multi-stage DCI to provide a first plurality of coded bits and transmitting the first plurality of coded bits in the first OFDM symbol. Transmitting the second part of the multi-stage DCI in the second OFDM symbol comprises encoding the second part of the multi-stage DCI using a polar encoder that uses the first plurality of coded bits as frozen bits to provide a second plurality of coded bits and transmitting the second plurality of coded bits in the second OFDM symbol.

In some embodiments, transmitting the first part of the multi-stage DCI in the first OFDM symbol comprises attaching the first CRC bits to the first part of the multi-stage DCI to provide a first sequence of bits comprising the first part of the multi-stage DCI and the first CRC bits, encoding the first sequence of bits to provide a first plurality of coded bits, and transmitting the first plurality of coded bits in the first OFDM symbol. Transmitting the second part of the multi-stage DCI in the second OFDM symbol comprises encoding the second part of the multi-stage DCI using a polar encoder that uses the first part of the multi-stage DCI and the first CRC bits as frozen bits to provide a second plurality of coded bits and transmitting the second plurality of coded bits in the second OFDM symbol.

In some embodiments, transmitting the first part of the multi-stage DCI in the first OFDM symbol comprises attaching the first CRC bits to the first part of the multi-stage DCI to provide a first sequence of bits comprising the first part of the multi-stage DCI and the first CRC bits, encoding the first sequence of bits to provide a first plurality of coded bits, and transmitting the first plurality of coded bits in the first OFDM symbol. Transmitting the second part of the multi-stage DCI in the second OFDM symbol comprises encoding the second part of the multi-stage DCI using a polar encoder that uses the first plurality of coded bits as frozen bits to provide a second plurality of coded bits and transmitting the second plurality of coded bits in the second OFDM symbol.

In some embodiments, transmitting the first part of the multi-stage DCI in the first OFDM symbol comprises attaching first CRC bits to the first part of the multi-stage DCI to provide a first sequence of bits comprising the first part of the multi-stage DCI and the first CRC bits, encoding the first sequence of bits to provide a first plurality of coded bits, and transmitting the first plurality of coded bits in the first OFDM symbol. Transmitting the second part of a multi-stage DCI in the second OFDM symbol comprises attaching second CRC bits to the second part of the multi-stage DCI to provide a second sequence of bits comprising the second part of the multi-stage DCI and the second CRC bits, encoding the second sequence of bits using a polar encoder that uses the first part of the multi-stage DCI and the first CRC bits as frozen bits to provide a second plurality of coded bits, and transmitting the second plurality of coded bits in the second OFDM symbol.

In some embodiments, transmitting the first part of the multi-stage DCI in the first OFDM symbol comprises attaching first CRC bits to the first part of the multi-stage DCI to provide a first sequence of bits comprising the first part of the multi-stage DCI and the first CRC bits, encoding the first sequence of bits to provide a first plurality of coded bits, and transmitting the first plurality of coded bits in the first OFDM symbol. Transmitting the second part of a multi-stage DCI in the second OFDM symbol comprises attaching second CRC bits to the second part of the multi-stage DCI to provide a second sequence of bits comprising the second part of the multi-stage DCI and the second CRC bits, encoding the second sequence of bits using a polar encoder that uses the first plurality of coded bits as frozen bits to provide a second plurality of coded bits, and transmitting the second plurality of coded bits in the second OFDM symbol.

In some embodiments, transmitting the first part of the multi-stage DCI in the first OFDM symbol comprises encoding the first part of the multi-stage DCI to provide a first plurality of coded bits and transmitting the first plurality of coded bits in the first OFDM symbol. Transmitting the second part of a multi-stage DCI in the second OFDM symbol comprises attaching CRC bits to the second part of the multi-stage DCI to provide a sequence of bits comprising the second part of the multi-stage DCI and the CRC bits, encoding the sequence of bits using a polar encoder that uses the first part of the multi-stage DCI as frozen bits to provide a second plurality of coded bits, and transmitting the second plurality of coded bits in the second OFDM symbol.

In some embodiments, transmitting the first part of the multi-stage DCI in the first OFDM symbol comprises encoding the first part of the multi-stage DCI to provide a first plurality of coded bits and transmitting the first plurality of coded bits in the first OFDM symbol. Transmitting the second part of a multi-stage DCI in the second OFDM symbol comprises attaching CRC bits to the second part of the multi-stage DCI to provide a sequence of bits comprising the second part of the multi-stage DCI and the CRC bits, encoding the sequence of bits using a polar encoder that uses the first plurality of coded bits as frozen bits to provide a second plurality of coded bits, and transmitting the second plurality of coded bits in the second OFDM symbol.

In some embodiments, transmitting the first part of the multi-stage DCI in the first OFDM symbol comprises encoding the first part of the multi-stage DCI using a first polar encoder to provide a first plurality of coded bits and transmitting the first plurality of coded bits in the first OFDM symbol. Transmitting the second part of the multi-stage DCI in the second OFDM symbol comprises jointly encoding the second part of the multi-stage DCI together with the first part of the multi-stage DCI using a second polar encoder to provide a second plurality of coded bits, the first polar encoder being nested within the second polar encoder, and transmitting the second plurality of coded bits in the second OFDM symbol.

Embodiments of a radio access node for a cellular communications network to transmit multi-stage DCI are also disclosed. In some embodiments, a radio access node is adapted to transmit a first part of a multi-stage DCI in a first OFDM symbol and transmit a second part of the multi-stage DCI in a second OFDM symbol that is subsequent to the first OFDM symbol, wherein CRC bits are attached to the first part of the multi-stage DCI and/or CRC bits are attached to the second part of the multi-stage DCI.

In some embodiments, a radio access node comprises one or more transmitters and one or more processors operable to transmit, via the one or more transmitters, a first part of a multi-stage DCI in a first OFDM symbol and transmit, via the one or more transmitters, a second part of the multi-stage DCI in a second OFDM symbol that is subsequent to the first OFDM symbol. CRC bits are attached to the first part of the multi-stage DCI and/or CRC bits are attached to the second part of the multi-stage DCI.

Embodiments of a method of operation of a wireless device are also disclosed. In some embodiments, a method of operation of a wireless device in a cellular communications network to receive multi-stage DCI comprises receiving a first part of a multi-stage DCI in a first OFDM symbol and receiving a second part of the multi-stage DCI in a second OFDM symbol that is subsequent to the first OFDM symbol, wherein CRC bits are attached to the first part of the multi-stage DCI and/or CRC bits are attached to the second part of the multi-stage DCI. In some embodiments, the first part of the multi-stage DCI is encoded using a polar encoder and/or the second part of the multi-stage DCI is encoded using a polar encoder.

In some embodiments, first CRC bits are attached to the first part of the multi-stage DCI and second CRC bits are attached to the second part of the multi-stage DCI.

In some embodiments, first CRC bits are attached to the first part of the multi-stage DCI prior to encoding and second CRC bits are attached to the second part of the multi-stage DCI prior to encoding.

In some embodiments, CRC bits are attached to the first part of the multi-stage DCI and CRC bits are not attached to the second part of the multi-stage DCI.

In some embodiments, CRC bits are attached to the second part of the multi-stage DCI and CRC bits are not attached to the first part of the multi-stage DCI. In some embodiments, the CRC bits attached to the second part of the multi-stage DCI are CRC bits for both the first and second parts of the multi-stage DCI.

In some embodiments, the first part of the multi-stage DCI is encoded using a first channel coding technique and the second part of the multi-stage DCI is encoded using a second channel coding technique that is different than the first channel coding technique. In some embodiments, one of the first channel coding technique and the second channel coding technique is a polar coding technique.

In some embodiments, the first part of the multi-stage DCI and the second part of the multi-stage DCI are encoded using a same channel coding technique.

In some embodiments, receiving the first part of the multi-stage DCI in the first OFDM symbol comprises receiving, in the first OFDM symbol, a first plurality of coded bits that correspond to the first part of the multi-stage DCI and decoding the first plurality of coded bits to provide a first plurality of hard bit decisions for the first part of the multi-stage DCI. Receiving the second part of the multi-stage DCI in the second OFDM symbol comprises receiving, in the second OFDM symbol, a second plurality of coded bits that correspond to the second part of the multi-stage DCI and decoding the second plurality of coded bits using a polar decoder that uses the first plurality of hard bit decisions as frozen bits to provide a second plurality of hard bit decisions for the second part of the multi-stage DCI.

In some embodiments, receiving the first part of the multi-stage DCI in the first OFDM symbol comprises receiving, in the first OFDM symbol, a first plurality of coded bits that correspond to the first part of the multi-stage DCI and decoding the first plurality of coded bits to provide a first plurality of hard bit decisions for the first part of the multi-stage DCI. Receiving the second part of the multi-stage DCI in the second OFDM symbol comprises receiving, in the second OFDM symbol, a second plurality of coded bits that correspond to the second part of the multi-stage DCI and decoding the second plurality of coded bits using a polar decoder that uses the first plurality of coded bits as frozen bits to provide a second plurality of hard bit decisions for the second part of the multi-stage DCI.

In some embodiments, receiving the first part of the multi-stage DCI in the first OFDM symbol comprises receiving, in the first OFDM symbol, a first plurality of coded bits that correspond to the first part of the multi-stage DCI and first CRC bits attached to the first part of the multi-stage DCI and decoding the first plurality of coded bits to provide a first plurality of hard bit decisions for the first part of the multi-stage DCI and the first CRC bits. Receiving the second part of the multi-stage DCI in the second OFDM symbol comprises receiving, in the second OFDM symbol, a second plurality of coded bits that correspond to the second part of the multi-stage DCI and decoding the second plurality of coded bits using a polar decoder that uses the first plurality of hard bit decisions as frozen bits to provide a second plurality of hard bit decisions for the second part of the multi-stage DCI.

In some embodiments, receiving the first part of the multi-stage DCI in the first OFDM symbol comprises receiving, in the first OFDM symbol, a first plurality of coded bits that correspond to the first part of the multi-stage DCI and first CRC bits attached to the first part of the multi-stage DCI and decoding the first plurality of coded bits to provide a first plurality of hard bit decisions for the first part of the multi-stage DCI and the first CRC bits. Receiving the second part of the multi-stage DCI in the second OFDM symbol comprises receiving, in the second OFDM symbol, a second plurality of coded bits that correspond to the second part of the multi-stage DCI and decoding the second plurality of coded bits using a polar decoder that uses the first plurality of coded bits as frozen bits to provide a second plurality of hard bit decisions for the second part of the multi-stage DCI.

In some embodiments, receiving the first part of the multi-stage DCI in the first OFDM symbol comprises receiving, in the first OFDM symbol, a first plurality of coded bits that correspond to the first part of the multi-stage DCI and first CRC bits attached to the first part of the multi-stage DCI and decoding the first plurality of coded to provide a first plurality of hard bit decisions for the first part of the multi-stage DCI and the first CRC bits. Receiving the second part of the multi-stage DCI in the second OFDM symbol comprises receiving, in the second OFDM symbol, a second plurality of coded bits that correspond to the second part of the multi-stage DCI and second CRC bits attached to the second part of the multi-stage DCI and decoding the second plurality of coded bits using a polar decoder that uses the first plurality of hard bit decisions as frozen bits to provide a second plurality of hard bit decisions for the second part of the multi-stage DCI and the second CRC bits.

In some embodiments, receiving the first part of the multi-stage DCI in the first OFDM symbol comprises receiving, in the first OFDM symbol, a first plurality of coded bits that correspond to the first part of the multi-stage DCI and first CRC bits attached to the first part of the multi-stage DCI and decoding the first plurality of coded bits to provide a first plurality of hard bit decisions for the first part of the multi-stage DCI and the first CRC bits. Receiving the second part of the multi-stage DCI in the second OFDM symbol comprises receiving, in the second OFDM symbol, a second plurality of coded bits that correspond to the second part of the multi-stage DCI and second CRC bits attached to the second part of the multi-stage DCI and decoding the second plurality of coded bits using a polar decoder that uses the first plurality of coded bits as frozen bits to provide a second plurality of hard bit decisions for the second part of the multi-stage DCI and the second CRC bits.

In some embodiments, receiving the first part of the multi-stage DCI in the first OFDM symbol comprises receiving, in the first OFDM symbol, a first plurality of coded bits that correspond to the first part of the multi-stage DCI and decoding the first plurality of coded to provide a first plurality of hard bit decisions for the first part of the multi-stage DCI. Receiving the second part of the multi-stage DCI in the second OFDM symbol comprises receiving, in the second OFDM symbol, a second plurality of coded bits that correspond to the second part of the multi-stage DCI and CRC bits attached to the second part of the multi-stage DCI and decoding the second plurality of coded bits using a polar decoder that uses the first plurality of hard bit decisions as frozen bits to provide a second plurality of hard bit decisions for the second part of the multi-stage DCI and the CRC bits.

In some embodiments, receiving the first part of the multi-stage DCI in the first OFDM symbol comprises receiving, in the first OFDM symbol, a first plurality of coded bits that correspond to the first part of the multi-stage DCI and decoding the first plurality of coded bits to provide a first plurality of hard bit decisions for the first part of the multi-stage DCI. Receiving the second part of the multi-stage DCI in the second OFDM symbol comprises receiving, in the second OFDM symbol, a second plurality of coded bits that correspond to the second part of the multi-stage DCI and CRC bits attached to the second part of the multi-stage DCI and decoding the second plurality of coded bits using a polar decoder that uses the first plurality of coded bits as frozen bits to provide a second plurality of hard bit decisions for the second part of the multi-stage DCI and the CRC bits.

In some embodiments, receiving the first part of the multi-stage DCI in the first OFDM symbol comprises decoding the first part of the multi-stage DCI using a first polar decoder to provide a first plurality of hard bit decisions for the first part of the multi-stage DCI and receiving the second part of the multi-stage DCI in the second OFDM symbol comprises decoding the second part of the multi-stage DCI with the assistance of the first part of the multi-stage DCI using a second polar decoder to provide a second plurality of hard bit decisions for the second part of the multi-stage DCI, the first polar decoder being nested within the second polar decoder.

Embodiments of a wireless device are also disclosed. In some embodiments, a wireless device for a cellular communications network to receive multi-stage DCI is adapted to receive a first part of a multi-stage DCI in a first OFDM symbol and receive a second part of the multi-stage DCI in a second OFDM symbol that is subsequent to the first OFDM symbol, wherein CRC bits are attached to the first part of the multi-stage DCI and/or CRC bits are attached to the second part of the multi-stage DCI.

In some embodiments, a wireless device for a cellular communications network to receive multi-stage DCI comprises one or more receivers and one or more processors operable to receive a first part of a multi-stage DCI in a first OFDM symbol and receive a second part of the multi-stage DCI in a second OFDM symbol that is subsequent to the first OFDM symbol, wherein CRC bits are attached to the first part of the multi-stage DCI and/or CRC bits are attached to the second part of the multi-stage DCI.

BRIEF DESCRIPTION OF THE DRAWINGS

The accompanying drawing figures incorporated in and forming a part of this specification illustrate several aspects of the disclosure, and together with the description serve to explain the principles of the disclosure.

DETAILED DESCRIPTION

Figure 1:
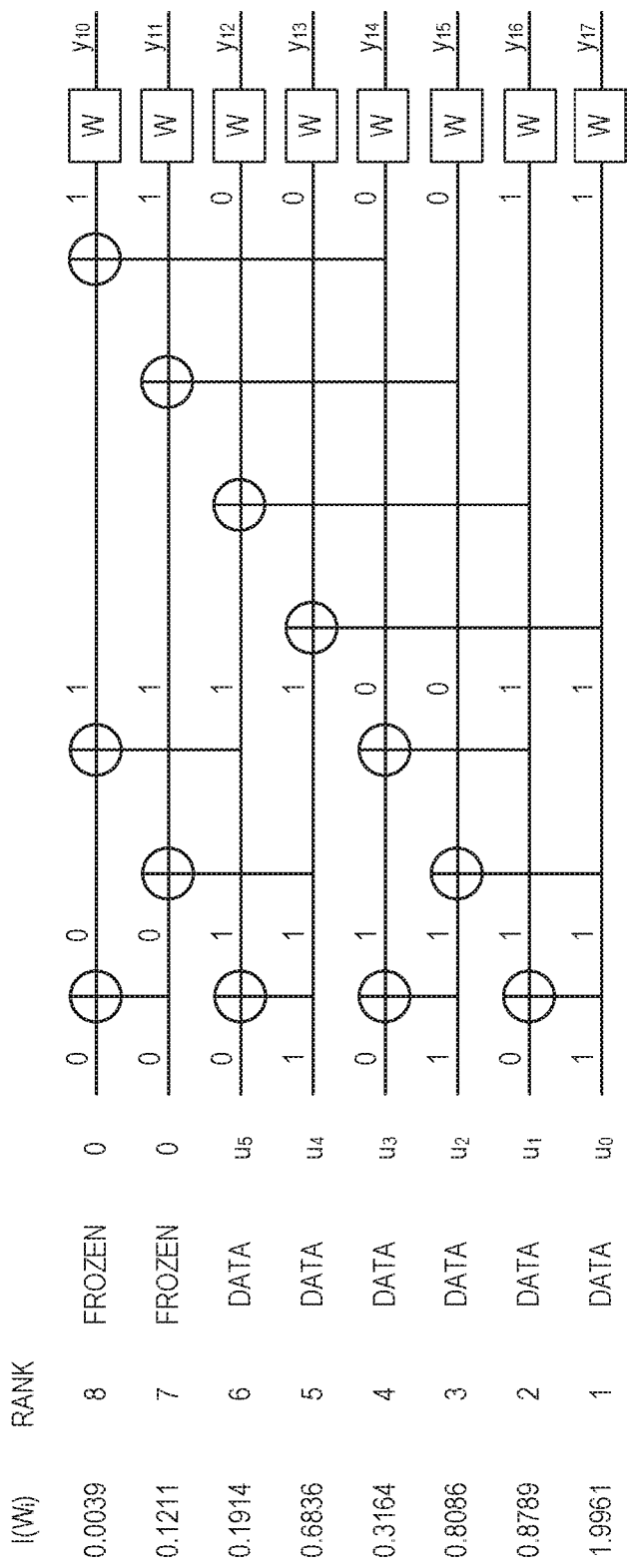
FIG. 1 is an example of a polar code structure with N=8 which serves as the first transmission in Hybrid Automatic Repeat Request (HARQ) with incremental redundancy.
Figure 2:
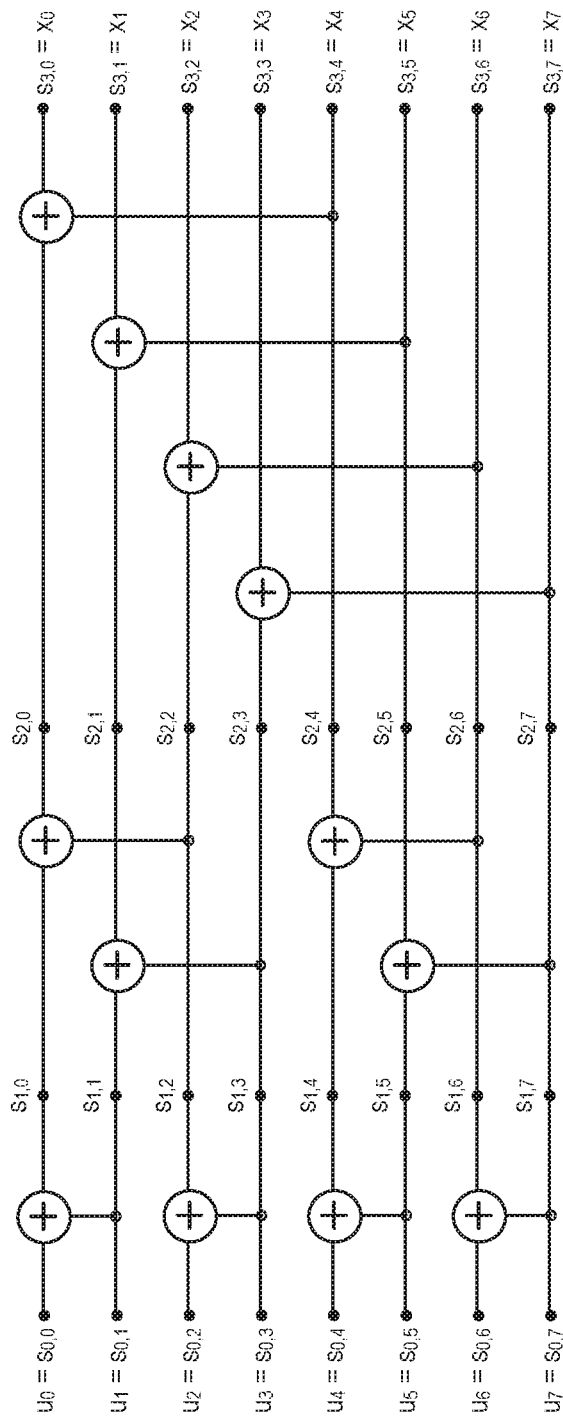
FIG. 2 illustrates the labeling of intermediate information bits during polar encoding with N=8.
Figure 3:
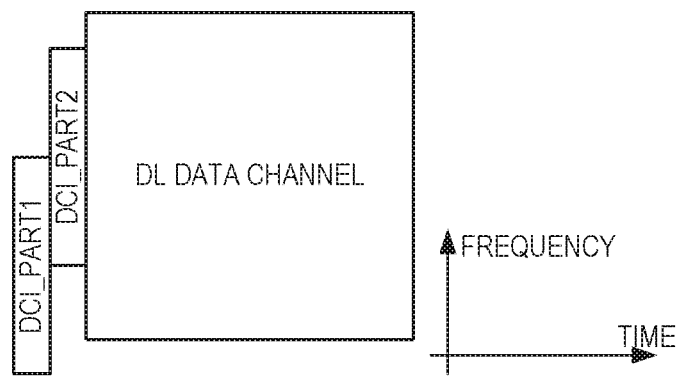
FIG. 3 illustrate an example of two-stage Downlink Control Information (DCI) where the first stage DCI resides in an Orthogonal Frequency Division Multiplexing (OFDM) symbol dedicated to control and the second stage DCI resides in a later OFDM symbol that is also dedicated to control.
Figure 4:
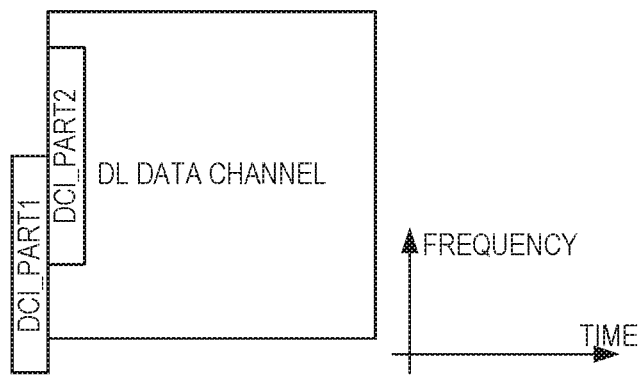
FIG. 4 illustrate an example of two-stage DCI where the first stage DCI resides in an OFDM symbol dedicated to control and the second stage DCI resides in a later OFDM symbol that is used for downlink data transmission.

The embodiments set forth below represent information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure.

In the following description, numerous specific details are set forth. However, it is understood that embodiments of the present disclosure may be practiced without these specific details. In other instances, well-known circuits, structures, and techniques have not been shown in detail in order not to obscure the understanding of this description. Those of ordinary skill in the art, with the included descriptions, will be able to implement appropriate functionality without undue experimentation.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to implement such feature, structure, or characteristic in connection with other embodiments whether or not explicitly described.

In the following description and claims, the terms "coupled" and "connected," along with their derivatives, may be used. It should be understood that these terms are not intended as synonyms for each other. "Coupled" is used to indicate that two or more elements, which may or may not be in direct physical or electrical contact with each other, cooperate, or interact with each other. "Connected" is used to indicate the establishment of communication between two or more elements that are coupled with each other.

The embodiments set forth below represent information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure.

Radio Node: As used herein, a "radio node" is either a radio access node or a wireless device.

Radio Access Node: As used herein, a "radio access node" is any node in a radio access network of a cellular communications network that operates to wirelessly transmit and/or receive signals. Some examples of a radio access node include, but are not limited to, a base station (e.g., an enhanced or evolved Node B (eNB) in a Third Generation Partnership Project (3GPP) Long Term Evolution (LTE) network or a New Radio (NR) base station (gNB) in a 3GPP NR network), a high-power or macro base station, a low-power base station (e.g., a micro base station, a pico base station, a home eNB, or the like), and a relay node.

Core Network Node: As used herein, a "core network node" is any type of node in a core network. Some examples of a core network node include, e.g., a Mobility Management Entity (MME), a Packet Data Network Gateway (P-GW), a Service Capability Exposure Function (SCEF), an Authentication Management Function (AMF), or the like.

Wireless Device: As used herein, a "wireless device" is any type of device that has access to (i.e., is served by) a cellular communications network by wirelessly transmitting and/or receiving signals to a radio access node(s). Some examples of a wireless device include, but are not limited to, a User Equipment device (UE) in a 3GPP network and a Machine Type Communication (MTC) device.

Network Node: As used herein, a "network node" is any node that is either part of the radio access network or the core network of a cellular communications network/system.

Note that the description given herein focuses on a 3GPP cellular communications system and, as such, 3GPP NR and/or 3GPP LTE terminology or terminology similar to 3GPP NR and/or 3GPP LTE terminology is oftentimes used. However, the concepts disclosed herein are not limited to LTE, NR, or a 3GPP system.

According to various embodiments described herein, methods, apparatuses, and systems are provided to provide Cyclic Redundancy Check (CRC) error detection function for the multi-stage Downlink Control Information (DCI) and provide polar code design for error control of multi-stage DCI. These methods, apparatuses, and systems provide error detection and error control functions to control information which is sent in two or more separate steps. One of ordinary skill in the art would realize that various communication nodes (e.g., UE or other station) could perform various processes described herein. Other features and advantages will become obvious to one of ordinary skill in the art in light of the following detailed description and drawings.

Figure 5:
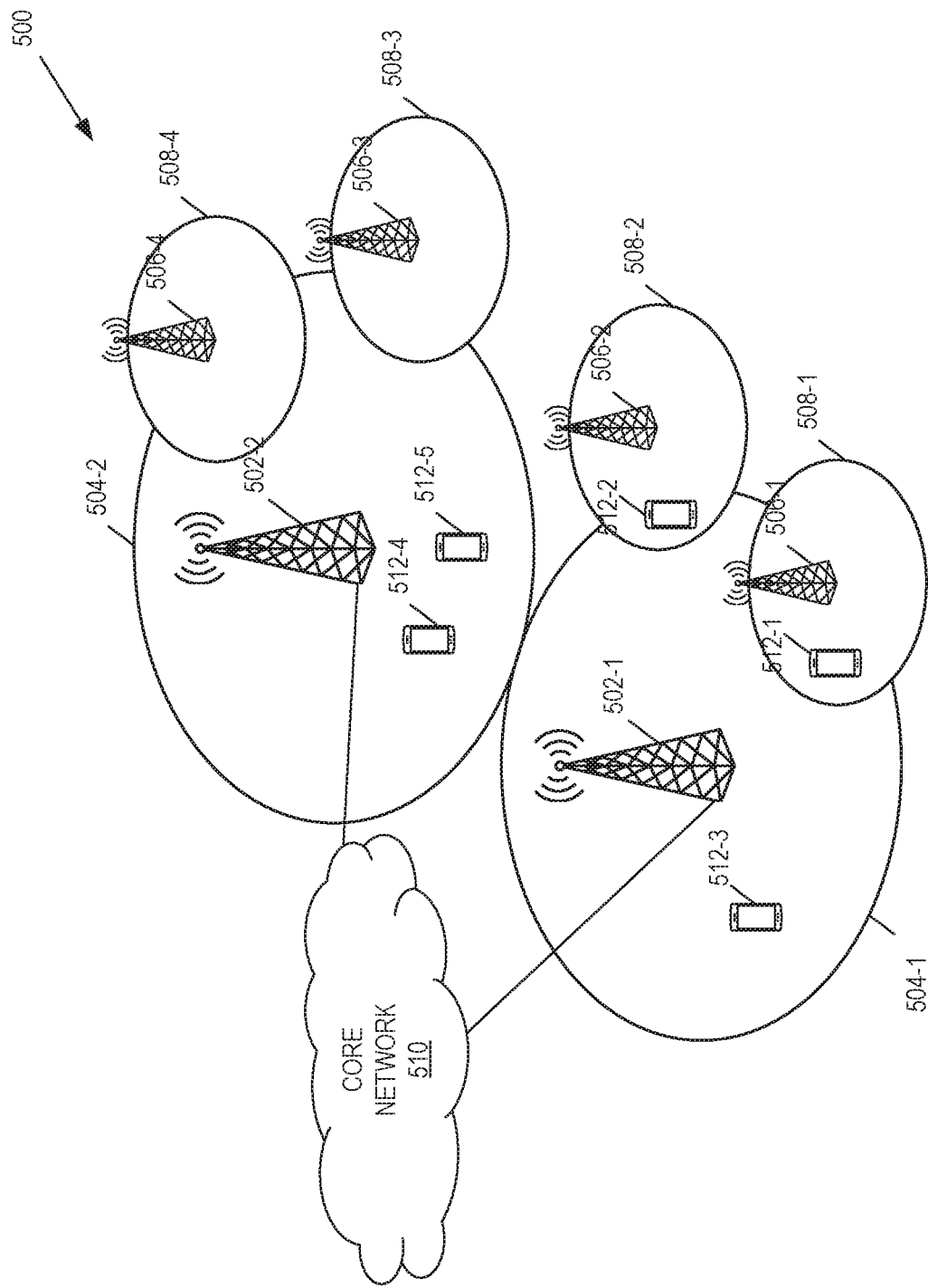
FIG. 5 illustrates one example of a cellular communications network in which embodiments of the present disclosure may be implemented.

FIG. 5 illustrates one example of a cellular communications network 500 in which embodiments of the present disclosure may be implemented. In the embodiments described herein, the cellular communications network 500 is an LTE network or a NR network. In this example, the cellular communications network 500 includes base stations 502-1 and 502-2, which in LTE are referred to as eNBs and in NR are referred to as gNBs, controlling corresponding macro cells 504-1 and 504-2. The base stations 502-1 and 502-2 are generally referred to herein collectively as base stations 502 and individually as base station 502. Likewise, the macro cells 504-1 and 504-2 are generally referred to herein collectively as macro cells 504 and individually as macro cell 504. The cellular communications network 500 also includes a number of low power nodes 506-1 through 506-4 controlling corresponding small cells 508-1 through 508-4. In LTE for example, the low power nodes 506-1 through 506-4 can be small base stations (such as pico or femto base stations) or Remote Radio Heads (RRHs), or the like. Notably, while not illustrated, one or more of the small cells 508-1 through 508-4 may alternatively be provided by the base stations 502. The low power nodes 506-1 through 506-4 are generally referred to herein collectively as low power nodes 506 and individually as low power node 506. Likewise, the small cells 508-1 through 508-4 are generally referred to herein collectively as small cells 508 and individually as small cell 508. The base stations 502 (and optionally the low power nodes 506) are connected to a core network 510.

The base stations 502 and the low power nodes 506 provide service to wireless devices 512-1 through 512-5 in the corresponding cells 504 and 508. The wireless devices 512-1 through 512-5 are generally referred to herein collectively as wireless devices 512 and individually as wireless device 512. In LTE for example, the wireless devices 512 are referred to as UEs. Note that the base stations 502 and 506 are types of radio access nodes and, as such, are also referred to herein as radio access nodes 502 and 506.

One advantage of two-stage DCI is to have a first part of the DCI (referred to herein as DCI_part1) decodable by the receiver (e.g., the wireless device 512) early, independent of a second part of the DCI (referred to herein as DCI_part2). Thus the receiver can obtain the information in DCI_part1 before the coded block of DCI_part2 arrives.

I. CRC Attachment of Multi-part Control Information

For single-stage DCI transmission, only one sequence of CRC bits is attached to the DCI. The CRC bits are used in blind decoding to identify the correct DCI among a list of M candidates.

For two-stage DCI transmission, both parts may need their own CRC bits and blind decoding. For the earlier DCI_part1, the receiver may or may not need to know if DCI_part1 is received correctly before receiving DCI_part2. If the receiver needs to know if DCI_part1 is received correctly before receiving DCI_part2, then DCI_part1 needs to be attached with its own CRC bits. This is the case in Alternative 1 and Alternative 2 below. If the receiver does not have to know if DCI_part1 is received correctly before receiving DCI_part2, then CRC bits dedicated to DCI_part1 can be avoided. This is the case in Alternative 3 below.

A. Alternative 1: CRC Bits Attached to Both DCI Parts

Figure 6:
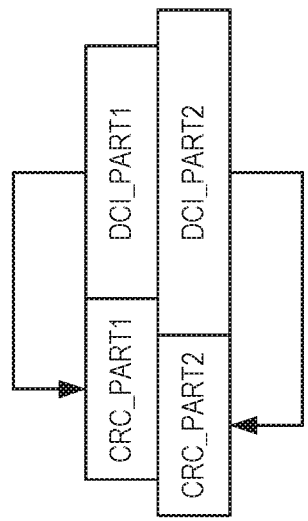
FIG. 6 illustrates an example of an embodiment of the present disclosure in which two sets of Cyclic Redundancy Check (CRC) bits are attached to two DCI parts of a multi-stage DCI individually.

In this alternative, two sets of CRC bits are attached to two DCI parts individually, as illustrated in FIG. 6. The two DCI parts are processed independently in the receiver.

DCI_part1 has its CRC bits for blind decoding of the candidates at the receiver. A length-L1 vector of CRC bits (CRC_part1) is generated for bit sequence DCI_part1. CRC_part1 is attached to the end of DCI_part1 before encoding by a first encoder (referred to herein as Encoder 1). The input to Encoder 1 is [DCI_part1 CRC_part1] (i.e., a concatenation of DCI_part1 and CRC_part1).

DCI_part2 has CRC bits as well for blind decoding at the receiver. A length-L2 vector of CRC bits (CRC_part2) is generated for bit sequence DCI_part1. CRC_part2 is attached to the end of DCI_part2 before encoding by a second encoder (referred to herein as Encoder 2). The input to Encoder 2 is [DCI_part2 CRC_part2] (i.e., a concatenation of DCI_part2 and CRC_part2).

Since part1 and part2 each have fewer number of blind decoding candidates than one-stage DCI, CRC_part1 and CRC_part2 can be reduced. In one example, L1=L2=8 bits. In another example, L1=8 bits, L2=6 bits.

Note that the two parts may be protected unevenly with different code rates depending on their relative importance.

B. Alternative 2: CRC Bits Attached to DCI_rt1 Only

Figure 7:
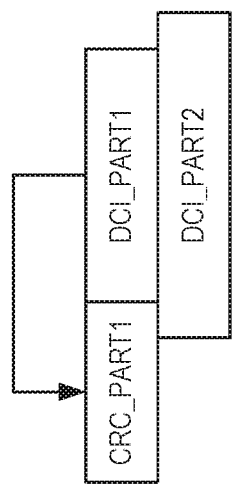
FIG. 7 illustrates an example of an embodiment of the present disclosure in which CRC bits are attached to the first part of a multi-stage DCI but no CRC bits are attached to the second part of the multi-stage DCI in accordance with some other embodiments of the present disclosure.

In this alternative, DCI_part1 has its CRC bits for blind decoding of the candidates at the receiver, as illustrated in FIG. 7. Processing of DCI_part1 is the same as in Alternative 1.

DCI_part1 provides sufficient information for reception of DCI_part2. No blind decoding of DCI_part2 is necessary, and DCI_part2 does not have CRC bits. This avoids the CRC overhead to DCI_part2.

C. Alternative 3: CRC Bits Attached to DCI_part2 Only

Figure 8:
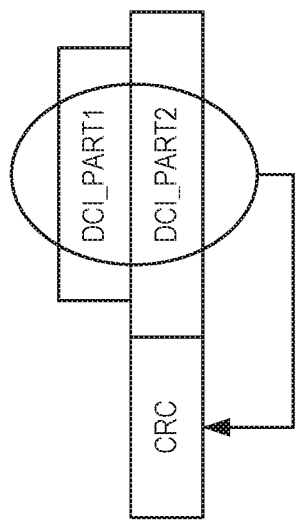
FIG. 8 illustrates an example of an embodiment of the present disclosure in which CRC bits are attached to the second part of a multi-stage DCI but no CRC bits are attached to the first part of the multi-stage DCI in accordance with some other embodiments of the present disclosure.

In this alternative, DCI_part1 does not have CRC bits attached before encoding by Encoder 1, but DCI_part2 does have CRS bits attached before encoding by Encoder 2, as illustrated in FIG. 8. This avoids the CRC overhead in transmitting DCI_part1. Processing of DCI_part1 leads to M1 candidates of DCI_part2.

CRC bits are attached to DCI_part2. To ensure correct reception of the entire DCI, the CRC bits are generated for the entire DCI, rather than DCI_part2 only. In this way, the blind decoding is performed over DCI candidates, where each candidate is composed of [DCI_part1 DCI_part2]. For each candidate of DCI_part1, M2 candidates of DCI_part2 may exist. Thus, there are a total of M=M1×M2 DCI candidates. Hence, the length L of CRC bits should be determined according to M, not M2.

II. Channel Coding of Multi-Part Control Information

Channel coding of multi-part control information is discussed in this section, using the example of two-part DCI and the CRC attachment of Alternative 1 discussed above.

Encoder 1 and Encoder 2 may or may not use the same channel coding techniques. To determine the channel coding technique for each, the information block size and code rate of DCI_part1 and DCI_part2 should be considered.

In one alternative, DCI_part1 and DCI_part2 use different channel coding techniques. This is desirable, for example, when DCI_part1 and DCI_part2 have substantially different lengths. DCI_part1, including CRC bits attached if any, is to be very small, e.g., K1=20 bits. In this case, DCI_part1 uses coding techniques appropriate for very short sizes (e.g., Reed-Mueller codes, tail-biting convolutional codes), while DCI_part2 uses polar codes.

In another alternative, DCI_part1 and DCI_part2 both use the same channel coding techniques. For example, both DCI_part1 and DCI_part2 use polar codes.

There are two ways to leverage the earlier transmission of DCI_part1 in decoding DCI_part2.

A. Hard Decision of DCI_part1 is used as Frozen Bits in Decoding DCI_part2

In this method, Encoder 1 and Encoder 2 are constructed independent of each other. The code, referred to as Code 1 hereinafter, that corresponds to Encoder 1 can be a polar code or other channel coding techniques (e.g., convolutional codes). Correspondingly, the code that corresponds to Encoder 2 is referred to as Code 2 hereinafter.

The received signal of coded bits at the output of Encoder 1 is not directly used in decoding DCI_part2. The only information Decoder 2 (i.e., the decoder used at the receiver to decode DCI_part2) receives from Decoder 1 (i.e., the decoder used at the receiver to decode DCI_part1) is the estimated value of DCI_part1 at the output of Decoder1, which is used as frozen bits in Decoder 2. Here, Decoder 1 corresponds to Encoder 1, and Decoder 2 corresponds to Encoder 2.

Two ways are possible for processing the bits that are used as frozen bits in Decoder 2. For example, if DCI_part1 are used as frozen bits in decoding of DCI_part2, then:
  One option is to assign a binary estimation of DCI_part1 as frozen bits for Decoder 2. Before decoding of DCI_part2 by Decoder 2, a magnitude of Log-Likelihood Ratios (LLRs) of the bits of DCI_part1 are assigned a value of infinity (i.e., a large value). This option is particularly useful when DCI_part1 has dedicated CRC bits (e.g., as in Alternatives 1 and 2 above) and the CRC of the received DCI_part1 passes correctly.
  Another option is to assign LLRs of the bits of DCI_part1 to LLRs of DCI_part1 after decoding by Decoder 1. In other words, the LLR values output by Decoder 1 for DCI_part1 are input as frozen bits for Decoder2. This option is helpful when there are no CRC bits attached to DCI_part1 (e.g., as in Alternative 3) or when the attached CRC of DCI_part1 fails.

Figure 9:
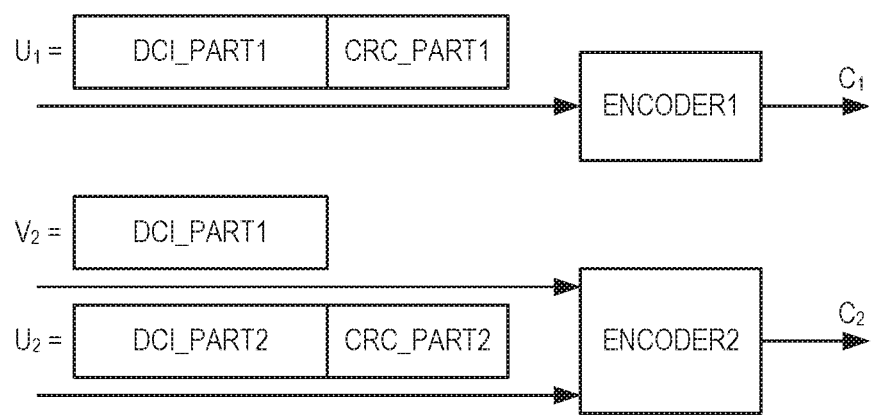
FIG. 9 illustrates an example embodiment in which the first part of the multi-stage DCI, but not the CRC bits attached to the first part of the multi-stage DCI, is directly used when encoding the second part of the multi-stage DCI.

If DCI_part1 has dedicated CRC bits, there are at least the following ways in assigning frozen bits in Decoder 2:
  Alternative 1: Only DCI_part1 is directly used in Decoder 2, not CRC_part1, as illustrated in FIG. 9. In this alternative, LLRs of DCI_part1 generated during decoding of code 1 (i.e., the code corresponding to the coded bits generated by Encoder 1) may be used as a priori input for the decoding of code 2 (i.e., the code corresponding to the coded bits generated by Encoder 2) for DCI_part2. Similarly, after the decoding of code2, LLRs of DCI_part1 may be generated for decoding of code 1 in the second round, and so forth in an iterative manner.
  Alternative 2: Both DCI_part1 and CRC_part1 are directly used as frozen bits in Decoder 2. In this alternative, iterative decoding of code 1 and code 2 can be used. After decoding of code 2, LLRs of {DCI_part1, CRC_part1} are generated. These LLRs are used in second round of decoding code 1.
  Alternative 3: Coded version of DCI_part1 is used as frozen bits in Decoder 2. By "coded version" here, any linear combination in the binary field is meant.
  Alternative 4: Coded version of [DCI_part1; CRC_part1] is used as frozen bits in Decoder 2.

The main advantage of coupling the code block for DCI_part2 with DCI_part1 is to increase the effective block length for DCI_part1 should the decoding of DCI_part1 based on Decoder 1 fail. Coupling DCI_part1 and DCI_part2 in these parity bits may improve the error detection capability. In this scheme, Code 1 need not be a polar code and can be Tail-Biting Convolutional Code (TBCC), for example.

B. Received Signal of Encoder 1 are Used in Decoding DCI_part2

In this method, DCI_part1 is encoded with a first polar code, and DCI_part2 is encoded with a second polar code where the first polar code is nested in the second polar code.

Figure 10:
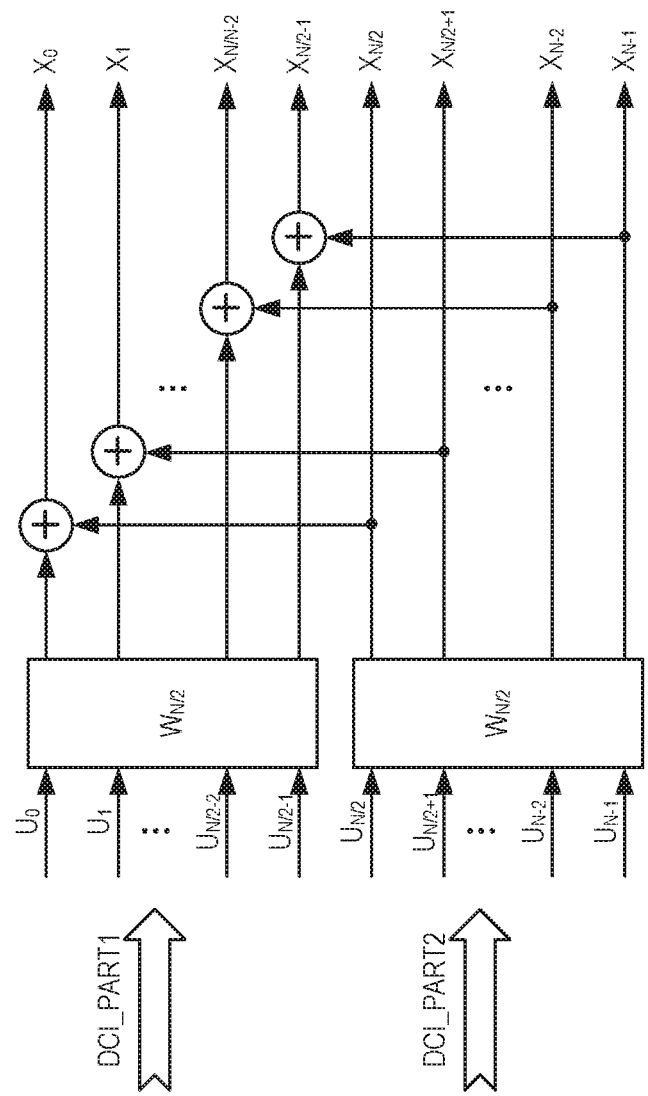
FIG. 10 illustrates an example embodiment in which the first part of the multi-stage DCI is encoded using a polar code of size N/2 and the second part of the multi-stage DCI is jointly encoded with the first part of the multi-stage DCI using a polar code of size N.

In one embodiment, the polar code of Encoder 1 has size N/2, and Encoder 1 is embedded in the structure of Encoder 2. For Encoder 2, DCI_part1 and DCI_part2 are jointly encoded with a polar code of size N, as illustrated in FIG. 10. In this case, the information bit locations for both DCI_part1 and DCI_part2 should be judiciously determined such that the information bit locations chosen for DCI_part1 are good for both decoding for the smaller polar code of size N/2 and for decoding the larger polar code of size N since DCI_part1 may need to be decodable independently of DCI_part2.

When decoding the first polar code, the polar decoder of size N/2 is run. When decoding the second polar code, the polar decoder of size N is run. The received signal of the output of Encoder 1 is used to generate LLR values for the relevant internal nodes of the second polar code. Decoding the second polar code can generate estimation of DCI_part1 as well as estimation of DCI_part2.

III. Overview of Some Embodiments Described Above

Figure 11:
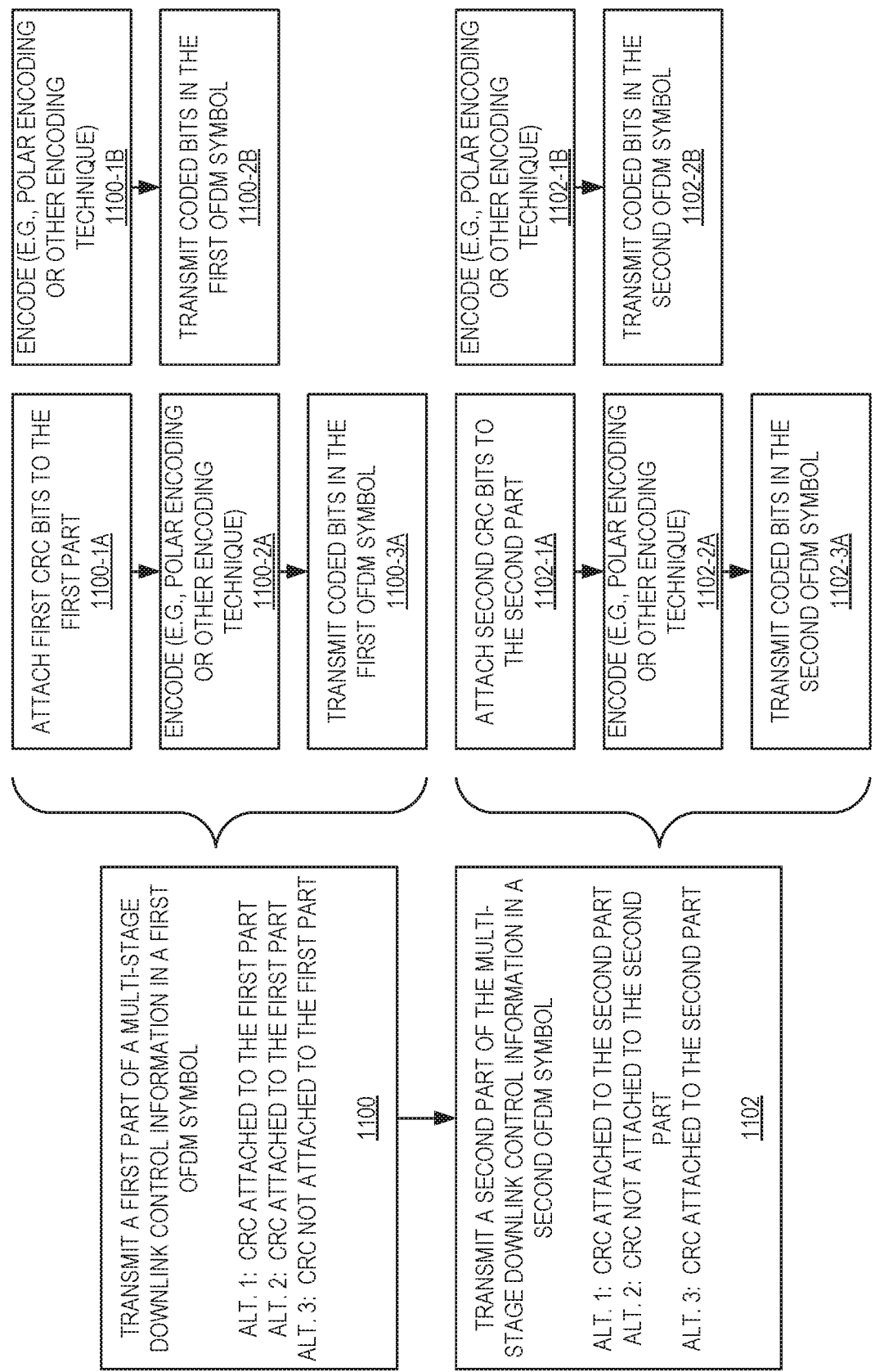
FIG. 11 is a flow chart that illustrates a method of transmitting multi-stage DCI in accordance with at least some embodiments of the present disclosure.

FIG. 11 is a flow chart that illustrates the operation of a radio node to transmit multi-stage DCI (e.g., two-stage DCI) in accordance with at least some of the embodiments described above. The radio node may be, for example, a radio access node 502 or 506 or a wireless device 512. As discussed above, the radio node transmits a first part of multi-stage DCI (e.g., DCI_part1) in a first Orthogonal Frequency Division Multiplexing (OFDM) symbol (step 1100). As also discussed above, in some embodiments (Alternatives 1 and 2), CRC is attached to the first part of the multi-stage DCI. More specifically, first CRC bits (e.g., CRC_part1) are attached to the first part of the multi-stage DCI (step 1100-1A). This provides a bit sequence that is a concatenation of the first part of the multi-stage DCI and the first CRC bits. This bit sequence is encoded by a first encoder (e.g., a polar encoder or some other type of encoder) (step 1100-2A). The resulting coded bits for the first part of the multi-stage DCI are transmitted in the first OFDM symbol (step 1100-3A).

In some other embodiments (Alternative 3), CRC bits are not attached to the first part of the multi-stage DCI. In this regard, the radio node encodes a bit sequence that corresponds to the first part of the multi-stage DCI using a first encoder (e.g., a polar encoder or some other type of encoder) (step 1100-1B). The radio node transits the resulting coded bits in the first OFDM symbol (step 1100-2B).

In a similar manner, the radio node transmits a second part of the multi-stage DCI (e.g., DCI_part2) in a second OFDM symbol (step 1102). As also discussed above, in some embodiments (Alternatives 1 and 3), CRC is attached to the second part of the multi-stage DCI. More specifically, second CRC bits (e.g., CRC_part2) are attached to the second part of the multi-stage DCI (step 1102-1A). This provides a bit sequence that is a concatenation of the second part of the multi-stage DCI and the second CRC bits. As discussed above, in some embodiments, CRC bits are not attached to the first part of the multi-stage DCI, and the CRC bits attached to the second part of the multi-stage DCI are CRC bits for both the first and second parts of the multi-stage DCI. The bit sequence resulting from the concatenation of the first part of the multi-stage DCI and the second CRC bits is encoded by a second encoder (e.g., a polar encoder or some other type of encoder) (step 1102-2A). As discussed above, in some embodiments, the first encoder and/or the second encoder is a polar encoder. In some embodiments, the first and second encoders are the same type of encoder. In some other embodiments, the first and second encoders are different types of encoders. The resulting coded bits for the second part of the multi-stage DCI are transmitted in the second OFDM symbol (step 1102-3A).

In some other embodiments (Alternative 2), CRC bits are not attached to the second part of the multi-stage DCI. In this regard, the radio node encodes a bit sequence that corresponds to the second part of the multi-stage DCI using the second encoder (e.g., a polar encoder or some other type of encoder) (step 1102-1B). The radio node transits the resulting coded bits in the second OFDM symbol (step 1102-2B).

As discussed above, in some embodiments, the second encoder is a polar encoder, and some version of the first part of the multi-stage DCI is used as frozen bits input to this polar encoder. More specifically, in some embodiments, a bit sequence that is the first part of the multi-stage DCI (i.e., before encoding) is used as frozen bits input to the second encoder. In some other embodiments, CRC bits are not attached to the first part of the multi-stage DCI, and the coded bits output by the first encoder are used as frozen bits input to the second encoder. In some other embodiments, CRC bits are attached to the first part of the multi-stage DCI, and a bit sequence formed by concatenating the CRC bits and the first part of the multi-stage DCI is used as frozen bits input to the second encoder. In some other embodiments, CRC bits are attached to the first part of the multi-stage DCI, and the coded bits output by the first encoder are used as frozen bits input to the second encoder.

Figure 12:
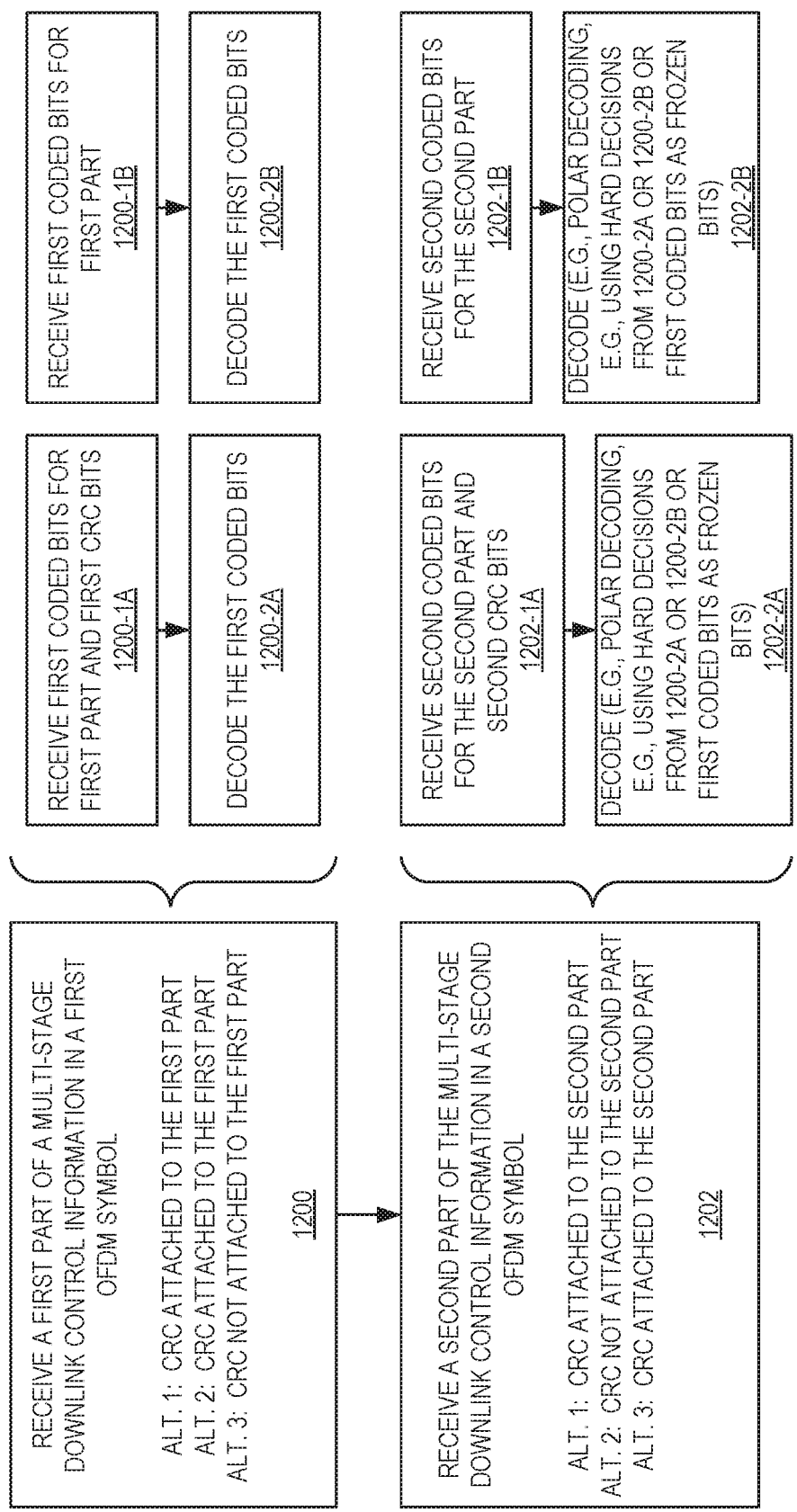
FIG. 12 is a flow chart that illustrates a method of receiving multi-stage DCI in accordance with at least some embodiments of the present disclosure.

FIG. 12 is a flow chart that illustrates the operation of a radio node to receive multi-stage DCI (e.g., two-stage DCI) in accordance with at least some of the embodiments described above. The radio node may be, for example, a radio access node 502 or 506 or a wireless device 512. As discussed above, the radio node receives a first part of multi-stage DCI (e.g., DCI_part1) in a first OFDM symbol (step 1200). As also discussed above, in some embodiments (Alternatives 1 and 2), CRC is attached to the first part of the multi-stage DCI. As such, the radio node receives, during the first OFDM symbol, first coded bits for: (a) the first part of the multi-stage DCI and (b) first CRC bit attached to the first part of the multi-stage DCI (step 1200-1A). The radio node decodes the first coded bits to obtain the first part of the multi-stage DCI and the first CRC bits (step 1200-2A). More specifically, at least in some embodiments, the decoding provides LLRs for the bits in a bit sequence that corresponds to a combination of the first part of the multi-stage DCI and the first CRC bits.

In some other embodiments (Alternative 3), CRC bits are not attached to the first part of the multi-stage DCI. In this regard, the radio node receives first coded bits for the first part of the multi-stage DCI (step 1200-1B) and decodes the first coded bits to obtain the first part of the multi-stage DCI (step 1200-2B). More specifically, at least in some embodiments, the decoding provides LLRs for the bits in a bit sequence that corresponds to the first part of the multi-stage DCI.

In a similar manner, the radio node receives a second part of multi-stage DCI (e.g., DCI_part2) in a second OFDM symbol (step 1202). As also discussed above, in some embodiments (Alternatives 1 and 3), CRC is attached to the second part of the multi-stage DCI. As such, the radio node receives, during the second OFDM symbol, second coded bits for: (a) the second part of the multi-stage DCI and (b) a second CRC bit attached to second first part of the multi-stage DCI (step 1202-1A). The radio node decodes the second coded bits to obtain the second part of the multi-stage DCI and the second CRC bits (step 1202-2A). More specifically, at least in some embodiments, the decoding provides LLRs for the bits in a bit sequence that corresponds to a combination of the second part of the multi-stage DCI and the second CRC bits. In some embodiments, the second decoder is a polar decoder, and hard decisions from the first decoder are used as frozen bits into to the second decoder. In some other embodiments, the second decoder is a polar decoder, and the first coded bits are used as frozen bits into to the second decoder.

In some other embodiments (Alternative 2), CRC bits are not attached to the second part of the multi-stage DCI. In this regard, the radio node receives second coded bits for the second part of the multi-stage DCI (step 1202-1B) and decodes the second coded bits to obtain the second part of the multi-stage DCI (step 1202-2B). More specifically, at least in some embodiments, the decoding provides LLRs for the bits in a bit sequence that corresponds to the second part of the multi-stage DCI. In some embodiments, the second decoder is a polar decoder, and hard decisions from the first decoder are used as frozen bits into to the second decoder. In some other embodiments, the second decoder is a polar decoder, and the first coded bits are used as frozen bits into to the second decoder.

IV. Example Embodiments of a Radio Access Node and a Wireless Device

Figure 13:
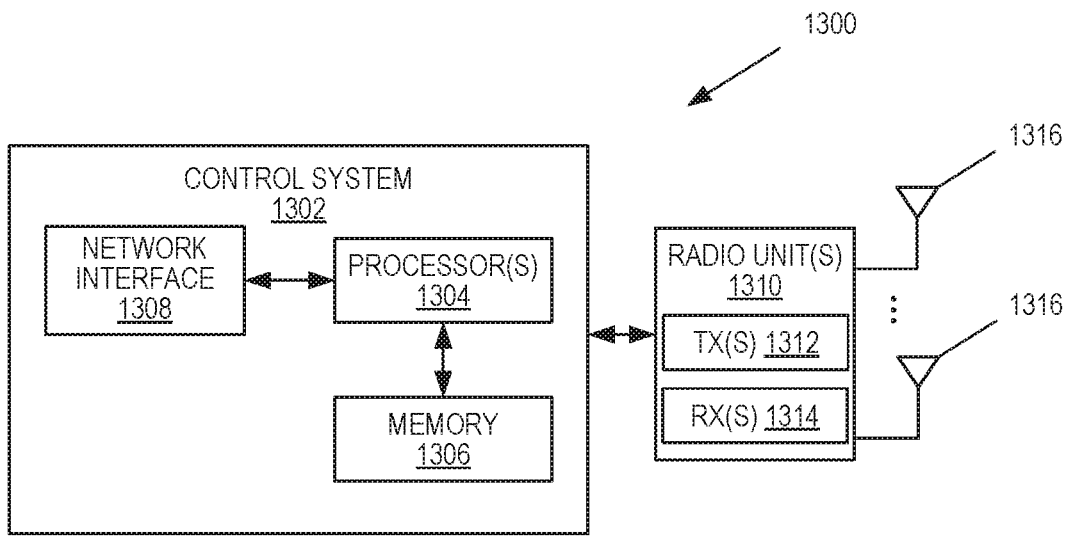
FIGS. 13 through 15 illustrate example embodiments of a radio access node.

FIG. 13 is a schematic block diagram of radio access node 1300 according to some embodiments of the present disclosure. The radio access node 1300 may be, for example, a base station 502 or 506. As illustrated, the radio access node 1300 includes a control system 1302 that includes one or more processors 1304 (e.g., Central Processing Units (CPUs), Application Specific Integrated Circuits (ASICs), Field Programmable Gate Arrays (FPGAs), and/or the like), memory 1306, and a network interface 1308. In addition, the radio access node 1300 includes one or more radio units 1310 that each includes one or more transmitters 1312 and one or more receivers 1314 coupled to one or more antennas 1316. In some embodiments, the radio unit(s) 1310 is external to the control system 1302 and connected to the control system 1302 via, e.g., a wired connection (e.g., an optical cable). However, in some other embodiments, the radio unit(s) 1310 and potentially the antenna(s) 1316 are integrated together with the control system 1302. The one or more processors 1304 operate to provide one or more functions of a radio access node 1300 as described herein. In some embodiments, the function(s) are implemented in software that is stored, e.g., in the memory 1306 and executed by the one or more processors 1304.

Figure 14:
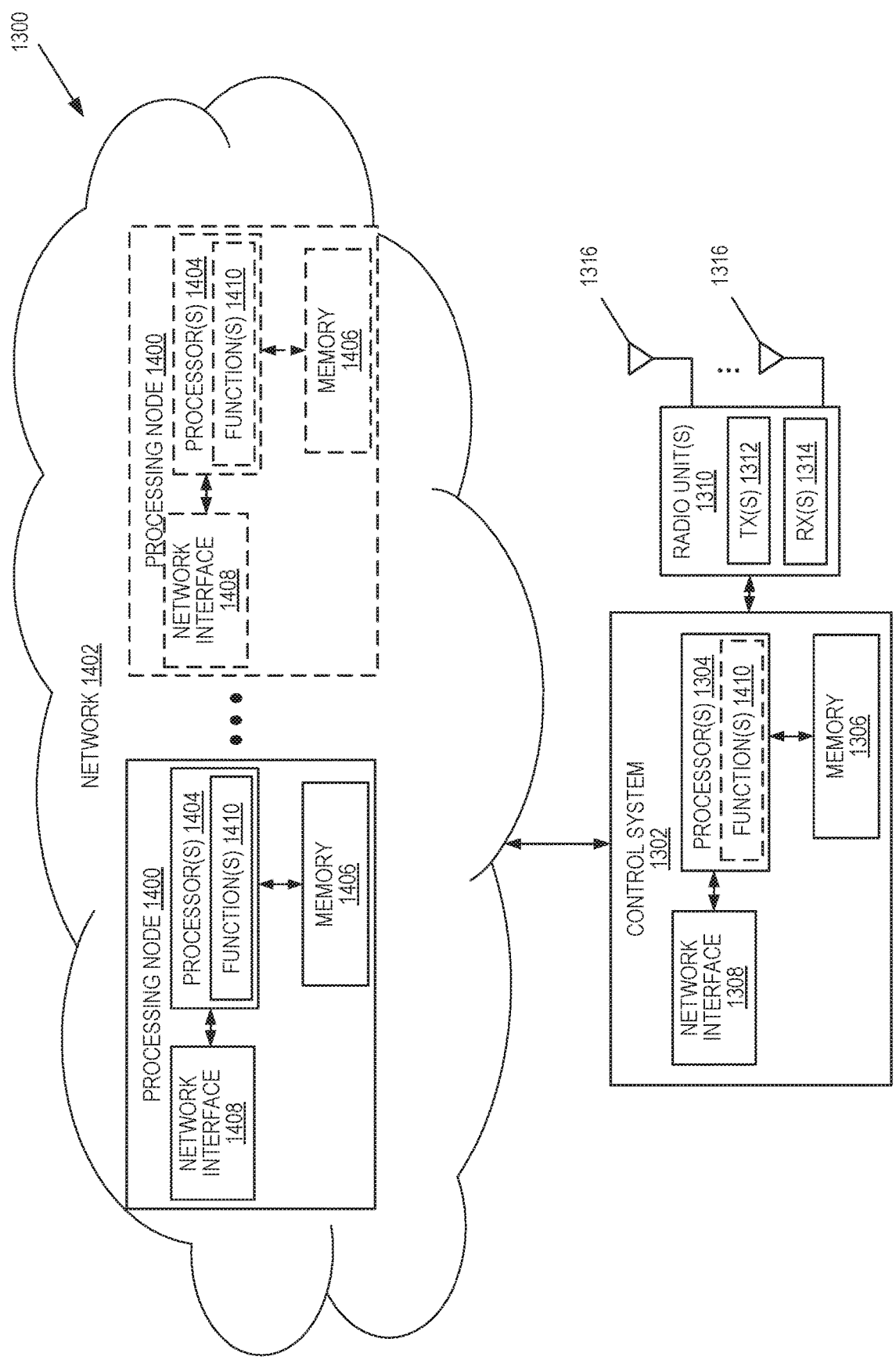

FIG. 14 is a schematic block diagram that illustrates a virtualized embodiment of the radio access node 1300 according to some embodiments of the present disclosure. This discussion is equally applicable to other types of network nodes. Further, other types of network nodes may have similar virtualized architectures.

As used herein, a "virtualized" radio access node is an implementation of the radio access node 1300 in which at least a portion of the functionality of the radio access node 1300 is implemented as a virtual component(s) (e.g., via a virtual machine(s) executing on a physical processing node (s) in a network(s)). As illustrated, in this example, the radio access node 1300 includes the control system 1302 that includes the one or more processors 1304 (e.g., CPUs, ASICs, FPGAs, and/or the like), the memory 1306, and the network interface 1308 and the one or more radio units 1310 that each includes the one or more transmitters 1312 and the one or more receivers 1314 coupled to the one or more antennas 1316, as described above. The control system 1302 is connected to the radio unit(s) 1310 via, for example, an optical cable or the like. The control system 1302 is connected to one or more processing nodes 1400 coupled to or included as part of a network(s) 1402 via the network interface 1308. Each processing node 1400 includes one or more processors 1404 (e.g., CPUs, ASICs, FPGAs, and/or the like), memory 1406, and a network interface 1408.

In this example, functions 1410 of the radio access node 1300 described herein are implemented at the one or more processing nodes 1400 or distributed across the control system 1302 and the one or more processing nodes 1400 in any desired manner. In some particular embodiments, some or all of the functions 1410 of the radio access node 1300 described herein are implemented as virtual components executed by one or more virtual machines implemented in a virtual environment(s) hosted by the processing node(s) 1400. As will be appreciated by one of ordinary skill in the art, additional signaling or communication between the processing node(s) 1400 and the control system 1302 is used in order to carry out at least some of the desired functions 1410. Notably, in some embodiments, the control system 1302 may not be included, in which case the radio unit(s) 1310 communicate directly with the processing node(s) 1400 via an appropriate network interface(s).

In some embodiments, a computer program including instructions which, when executed by at least one processor, causes the at least one processor to carry out the functionality of radio access node 1300 or a node (e.g., a processing node 1400) implementing one or more of the functions 1410 of the radio access node 1300 in a virtual environment according to any of the embodiments described herein is provided. In some embodiments, a carrier comprising the aforementioned computer program product is provided. The carrier is one of an electronic signal, an optical signal, a radio signal, or a computer readable storage medium (e.g., a non-transitory computer readable medium such as memory).

Figure 15:
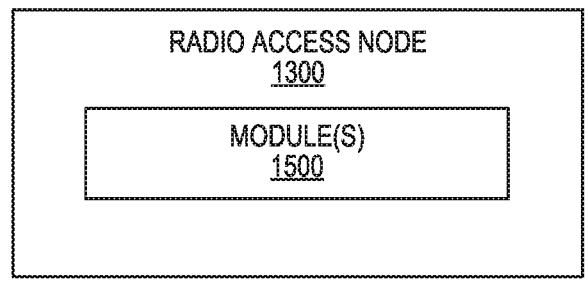

FIG. 15 is a schematic block diagram of the radio access node 1300 according to some other embodiments of the present disclosure. The radio access node 1300 includes one or more modules 1500, each of which is implemented in software. The module(s) 1500 provide the functionality of the radio access node 1300 described herein. This discussion is equally applicable to the processing node 1400 of FIG. 14 where the modules 1500 may be implemented at one of the processing nodes 1400 or distributed across multiple processing nodes 1400 and/or distributed across the processing node(s) 1400 and the control system 1302.

Figure 16:
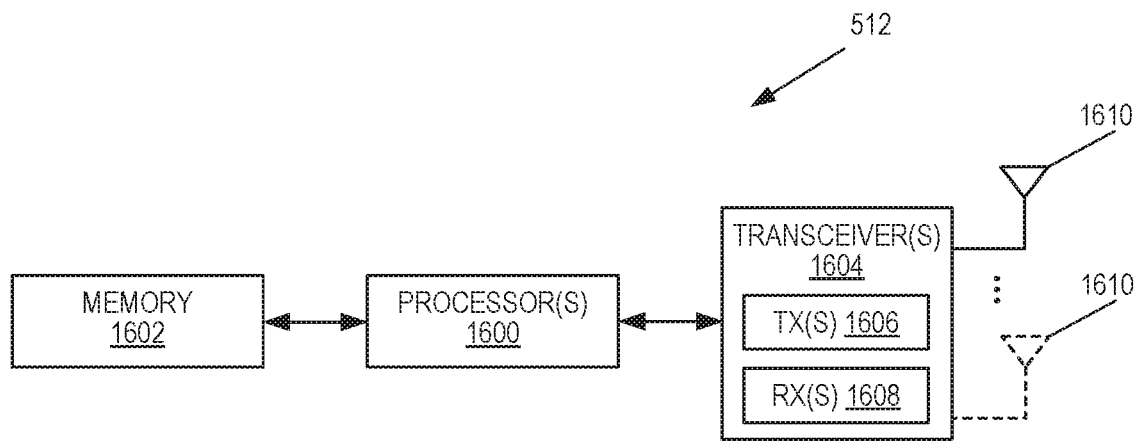
FIGS. 16 and 17 illustrate example embodiments of a wireless device.

FIG. 16 is a schematic block diagram of a UE 512 according to some embodiments of the present disclosure. As illustrated, the UE 512 includes one or more processors 1600 (e.g., CPUs, ASICs, FPGAs, and/or the like), memory 1602, and one or more transceivers 1604 each including one or more transmitters 1606 and one or more receivers 1608 coupled to one or more antennas 1610. In some embodiments, the functionality of the UE 512 described above may be fully or partially implemented in software that is, e.g., stored in the memory 1602 and executed by the processor(s) 1600.

In some embodiments, a computer program including instructions which, when executed by at least one processor, causes the at least one processor to carry out the functionality of the UE 512 according to any of the embodiments described herein is provided. In some embodiments, a carrier comprising the aforementioned computer program product is provided. The carrier is one of an electronic signal, an optical signal, a radio signal, or a computer readable storage medium (e.g., a non-transitory computer readable medium such as memory).

Figure 17:
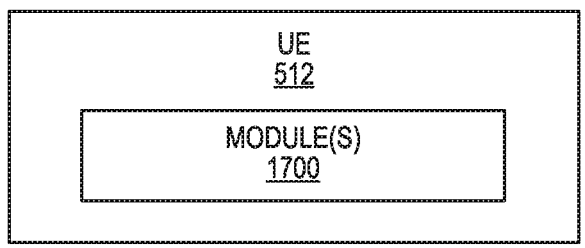

FIG. 17 is a schematic block diagram of the UE 512 according to some other embodiments of the present disclosure. The UE 512 includes one or more modules 1700, each of which is implemented in software. The module(s) 1700 provide the functionality of the UE 512 described herein.

While processes in the figures may show a particular order of operations performed by certain embodiments of the present disclosure, it should be understood that such order is exemplary (e.g., alternative embodiments may perform the operations in a different order, combine certain operations, overlap certain operations, etc.).

While the present disclosure has been described in terms of several embodiments, those skilled in the art will recognize that the present disclosure is not limited to the embodiments described, can be practiced with modification and alteration within the spirit and scope of the appended claims. The description is thus to be regarded as illustrative instead of limiting.

At least some of the following abbreviations may be used in this disclosure. If there is an inconsistency between abbreviations, preference should be given to how it is used above. If listed multiple times below, the first listing should be preferred over any subsequent listing(s).

3GPP Third Generation Partnership Project
    5G Fifth Generation
    AMF Authentication Management Function
    ASIC Application Specific Integrated Circuit
    CPU Central Processing Unit
    CRC Cyclic Redundancy Check
    DCI Downlink Control Information
    eNB Enhanced or Evolved Node B
    FPGA Field Programmable Gate Array
    gNB New Radio Base Station
    HARQ Hybrid Automatic Repeat Request
    LDPC Low-Density Parity-Check
    LLR Log-Likelihood Ratio
    LTE Long Term Evolution
    MCS Modulation and Coding Scheme
    ML Maximum-Likelihood
    MME Mobility Management Entity
    MTC Machine Type Communication
    NR New Radio
    OFDM Orthogonal Frequency Division Multiplexing
    P-GW Packet Data Network Gateway
    RRH Remote Radio Head
    SC Successive Cancellation
    SCEF Service Capability Exposure Function
    SCL Successive Cancellation List
    TBCC Tail-Biting Convolutional Code Those skilled in the art will recognize improvements and modifications to the embodiments of the present disclosure. All such improvements and modifications are considered within the scope of the concepts disclosed herein.

REFERENCES

[1] E. Arikan, "Channel Polarization: A Method for Constructing Capacity-Achieving Codes for Symmetric Binary-Input Memoryless Channels," IEEE Transactions on Information Theory, vol. 55, pp. 3051-3073, July 2009.

[2] I. Tal and A. Vardy, "List Decoding of polar codes," in Proceedings of IEEE Symp. Inf. Theory, pp. 1-5, 2011.

What is claimed is:

1. A method of operation of a radio access node in a cellular communications network to transmit multi-stage downlink control information, comprising:
    transmitting a first part of the multi-stage downlink control information in a first Orthogonal Frequency Division Multiplexing, OFDM, symbol; and
    transmitting a second part of the multi-stage downlink control information in a second OFDM symbol that is subsequent to the first OFDM symbol;
wherein Cyclic Redundancy Check, CRC, bits are attached to the first part of the multi-stage downlink control information and/or CRC bits are attached to the second part of the multi-stage downlink control information; wherein:
  transmitting the first part of the multi-stage downlink control information in the first OFDM symbol comprises:
    encoding the first part of the multi-stage downlink control information to provide a first plurality of coded bits; and
    transmitting the first plurality of coded bits in the first OFDM symbol; and
  transmitting the second part of the multi-stage downlink control information in the second OFDM symbol comprises:
    encoding the second part of the multi-stage downlink control information using a polar encoder that uses the first part of the multi-stage downlink control information as frozen bits to provide a second plurality of coded bits; and
    transmitting the second plurality of coded bits in the second OFDM symbol.

2. The method of claim 1 wherein first CRC bits are attached to the first part of the multi-stage downlink control information and second CRC bits are attached to the second part of the multi-stage downlink control information.

3. The method of claim 2 wherein transmitting the first part of the multi-stage downlink control information in the first OFDM symbol comprises:
  attaching the first CRC bits to the first part of the multi-stage downlink control information to provide a first sequence of bits comprising the first part of the multi-stage downlink control information and the first CRC bits;
  encoding the first sequence of bits to provide a first plurality of coded bits; and
  transmitting the first plurality of coded bits in the first OFDM symbol.

4. The method of claim 3 wherein transmitting the second part of the multi-stage downlink control information in the second OFDM symbol comprises:
  attaching the second CRC bits to the second part of the multi-stage downlink control information to provide a second sequence of bits comprising the second part of the multi-stage downlink control information and the second CRC bits;
  encoding the second sequence of bits to provide a second plurality of coded bits; and
  transmitting the second plurality of coded bits in the second OFDM symbol.

5. The method of claim 1 wherein CRC bits are attached to the first part of the multi-stage downlink control information and CRC bits are not attached to the second part of the multi-stage downlink control information.

6. The method of claim 1 wherein CRC bits are attached to the second part of the multi-stage downlink control information and CRC bits are not attached to the first part of the multi-stage downlink control information.

7. The method of claim 6 wherein the CRC bits attached to the second part of the multi-stage downlink control information are CRC bits for both the first and second parts of the multi-stage downlink control information.

8. The method of claim 1 wherein:
  the first part of the multi-stage downlink control information is encoded using a first channel coding technique; and
  the second part of the multi-stage downlink control information is encoded using a second channel coding technique that is different than the first channel coding technique.

9. The method of claim 8 wherein one of the first channel coding technique and the second channel coding technique is a polar coding technique.

10. The method of claim 1 wherein the first part of the multi-stage downlink control information and the second part of the multi-stage downlink control information are encoded using a same channel coding technique.

11. A radio access node for a cellular communications network to transmit multi-stage downlink control information, the radio access node comprising:
  one or more transmitters; and
  one or more processors operable to:
    transmit, via the one or more transmitters, a first part of the multi-stage downlink control information in a first Orthogonal Frequency Division Multiplexing, OFDM, symbol; and
    transmit, via the one or more transmitters, a second part of the multi-stage downlink control information in a second OFDM symbol that is subsequent to the first OFDM symbol;
  wherein Cyclic Redundancy Check, CRC, bits are attached to the first part of the multi-stage downlink control information and/or CRC bits are attached to the second part of the multi-stage downlink control information:
  wherein:
  transmitting the first part of the multi-stage downlink control information in the first OFDM symbol comprises:
    encoding the first part of the multi-stage downlink control information to provide a first plurality of coded bits; and
    transmitting the first plurality of coded bits in the first OFDM symbol; and
  transmitting the second part of the multi-stage downlink control information in the second OFDM symbol comprises:
    encoding the second part of the multi-stage downlink control information using a polar encoder that uses the first part of the multi-stage downlink control information as frozen bits to provide a second plurality of coded bits; and
    transmitting the second plurality of coded bits in the second OFDM symbol.

12. A method of operation of a wireless device in a cellular communications network to receive multi-stage downlink control information, comprising:
  receiving a first part of the multi-stage downlink control information in a first Orthogonal Frequency Division Multiplexing, OFDM, symbol; and
  receiving a second part of the multi-stage downlink control information in a second OFDM symbol that is subsequent to the first OFDM symbol;
  wherein Cyclic Redundancy Check, CRC, bits are attached to the first part of the multi-stage downlink control information and/or CRC bits are attached to the second part of the multi-stage downlink control information; wherein:
  receiving the first part of the multi-stage downlink control information in the first OFDM symbol comprises:
    the first part of the multi-stage downlink control information being encoded to provide a first plurality of coded bits; and receiving the first plurality of coded bits in the first OFDM symbol; and receiving the second part of the multi-stage downlink control information in the second OFDM symbol comprises:

the second part of the multi-stage downlink control information being encoded using a polar encoder that uses the first part of the multi-stage downlink control information as frozen bits to provide a second plurality of coded bits; and receiving the second plurality of coded bits in the second OFDM symbol.

13. The method of claim 12 wherein the first part of the multi-stage downlink control information is encoded using a polar encoder and/or the second part of the multi-stage downlink control information is encoded using a polar encoder.

14. The method of claim 12 wherein first CRC bits are attached to the first part of the multi-stage downlink control information and second CRC bits are attached to the second part of the multi-stage downlink control information.

15. The method of claim 12 wherein first CRC bits are attached to the first part of the multi-stage downlink control information prior to encoding and second CRC bits are attached to the second part of the multi-stage downlink control information prior to encoding.

16. The method of claim 12 wherein CRC bits are attached to the first part of the multi-stage downlink control information and CRC bits are not attached to the second part of the multi-stage downlink control information.

17. The method of claim 12 wherein CRC bits are attached to the second part of the multi-stage downlink control information and CRC bits are not attached to the first part of the multi-stage downlink control information.

18. The method of claim 17 wherein the CRC bits attached to the second part of the multi-stage downlink control information are CRC bits for both the first and second parts of the multi-stage downlink control information.

19. The method of claim 12 wherein:

the first part of the multi-stage downlink control information is encoded using a first channel coding technique; and the second part of the multi-stage downlink control information is encoded using a second channel coding technique that is different than the first channel coding technique.

20. The method of claim 19 wherein one of the first channel coding technique and the second channel coding technique is a polar coding technique.

21. The method of claim 12 wherein the first part of the multi-stage downlink control information and the second part of the multi-stage downlink control information are encoded using a same channel coding technique.

22. The method of claim 12 wherein:

receiving the first part of the multi-stage downlink control information in the first OFDM symbol comprises decoding the first part of the multi-stage downlink control information using a first polar decoder to provide a first plurality of hard bit decisions for the first part of the multi-stage downlink control information; and receiving the second part of the multi-stage downlink control information in the second OFDM symbol comprises decoding the second part of the multi-stage downlink control information with assistance of the first part of the multi-stage downlink control information using a second polar decoder to provide a second plurality of hard bit decisions for the second part of the multi-stage downlink control information, the first polar decoder being nested within the second polar decoder.

23. A wireless device for a cellular communications network to receive multi-stage downlink control information, the comprising:

one or more receivers; and one or more processors operable to:

receive a first part of the multi-stage downlink control information in a first Orthogonal Frequency Division Multiplexing, OFDM, symbol; and receive a second part of the multi-stage downlink control information in a second OFDM symbol that is subsequent to the first OFDM symbol;

wherein Cyclic Redundancy Check, CRC, bits are attached to the first part of the multi-stage downlink control information and/or CRC bits are attached to the second part of the multi-stage downlink control information;

wherein:

receiving the first part of the multi-stage downlink control information in the first OFDM symbol comprises:

the first part of the multi-stage downlink control information being encoded to provide a first plurality of coded bits; and receiving the first plurality of coded bits in the first OFDM symbol; and receiving the second part of the multi-stage downlink control information in the second OFDM symbol comprises:

the second part of the multi-stage downlink control information being encoded using a polar encoder that uses the first part of the multi-stage downlink control information as frozen bits to provide a second plurality of coded bits; and receiving the second plurality of coded bits in the second OFDM symbol.

24. A method of operation of a radio access node in a cellular communications network to transmit multi-stage downlink control information, comprising:

transmitting a first part of the multi-stage downlink control information in a first Orthogonal Frequency Division Multiplexing, OFDM, symbol; and transmitting a second part of the multi-stage downlink control information in a second OFDM symbol that is subsequent to the first OFDM symbol;

wherein Cyclic Redundancy Check, CRC, bits are attached to the first part of the multi-stage downlink control information and/or CRC bits are attached to the second part of the multi-stage downlink control information; wherein:

transmitting the first part of the multi-stage downlink control information in the first OFDM symbol comprises:

attaching first CRC bits to the first part of the multi-stage downlink control information to provide a first sequence of bits comprising the first part of the multi-stage downlink control information and the first CRC bits;

encoding the first sequence of bits to provide a first plurality of coded bits; and transmitting the first plurality of coded bits in the first OFDM symbol; and transmitting the second part of a multi-stage downlink control information in the second OFDM symbol comprises:

attaching second CRC bits to the second part of the multi-stage downlink control information to provide a second sequence of bits comprising the second part of the multi-stage downlink control information and the second CRC bits;
encoding the second sequence of bits using a polar encoder that uses the first part of the multi-stage downlink control information and the first CRC bits as frozen bits to provide a second plurality of coded bits; and
transmitting the second plurality of coded bits in the second OFDM symbol.

* * * * *